United States Patent [19]
Choo et al.

[11] Patent Number: 5,991,455
[45] Date of Patent: Nov. 23, 1999

[54] HASHING-BASED VECTOR QUANTIZATION

[75] Inventors: Chang Y. Choo, San Jose; Xiaonong Ran, Cupertino, both of Calif.

[73] Assignee: National Semiconductor Corporation, Santa Clara, Calif.

[21] Appl. No.: 09/018,107

[22] Filed: Feb. 3, 1998

Related U.S. Application Data

[62] Division of application No. 08/434,440, May 3, 1995, Pat. No. 5,832,131.

[51] Int. Cl.$^6$ ........................................ G06K 9/36
[52] U.S. Cl. ............................ 382/253; 348/418
[58] Field of Search ..................... 382/253, 248, 382/251, 232; 348/405, 414, 417, 418

[56] References Cited

U.S. PATENT DOCUMENTS

| | | | |
|---|---|---|---|
| 4,791,670 | 12/1988 | Copperi et al. | 395/2.31 |
| 4,979,039 | 12/1990 | Kisor et al. | 348/422 |
| 5,130,797 | 7/1992 | Murakami et al. | 348/416 |
| 5,231,485 | 7/1993 | Israelsen et al. | 348/405 |
| 5,282,255 | 1/1994 | Bovik et al. | 348/384 |
| 5,371,544 | 12/1994 | Jacquin et al. | 348/398 |
| 5,444,488 | 8/1995 | Goubault et al. | 348/414 |
| 5,535,305 | 7/1996 | Acero et al. | 395/2.1 |
| 5,649,030 | 7/1997 | Normile et al. | 382/253 |

OTHER PUBLICATIONS

Aho et al., *The Design and Analysis of Computer Algorithms*, Addison–Wesley Series, Jun. 1974, Bell Telephone Laboratories, Inc., pp. 110–113.

Choo et al., "Evaluation of Design Parameters for Cache Vector Quantization Systems", IEEE International Conf. On Image Procession, vol. I, Apr. 1994, pp. 129–133.

Feng et al., "A Self–Organizing Adaptive Vector Quantization Technique", Journal of Visual Communication and Image Representation, vol. 2, No. 2, Jun. 1991, pp. 129–137.

Gersho et al., *Vector Quantization and Signal Compression*, Kluwer Academic Publishers, Sep. 1992, pp. 410–423.

Kanada, "A Vectorization Technique of Hashing and its Application to Several Sorting Algorithms", IEEE/IEE PARBASE '90, pp. 147–151. Apr. 1990.

Linde et al., "An Algorithm for Vector Quantizer Design", IEEE Transactions on Communications, vol. COM–28, No. 1, Jan. 1980, pp. 84–94.

Nasrabadi et al., "Dynamic Finite–State Vector Quantization fo Digital Images", IEEE Trans. on Communication, vol. 42, No. 5, May 1994, pp. 2145–2154.

Panneerselvam et al., "New Architecture for Systolic Hashing", IEEE/IEE Systolic Arrays, Aug. 1988, International Conf., pp. 73–82.

Ramakrishna, "An Exact Probability Model for Finite Hash Tables", IEEE/IEE Date Engineering, Jul. 1988, 4th International Conf., pp. 362–368.

Sezan et al., *Motion Analysis and Image Sequence Processing*, Kluwer Academic Publishers, Jun. 1993, pp. 256–283.

Yen et al., "Hash Table and Sorted Array: A Case Study of Mult–Entry Data Structures in Massively Parallel Systems", IEEE/IEE Fronties of Massively Parallel Computation, Feb. 1990, pp. 51–54.

*Primary Examiner*—Christopher S. Kelley
*Attorney, Agent, or Firm*—Skjerven, Morrill, MacPherson, Franklin & Friel LLP; David T. Millers

[57] ABSTRACT

A hashing-based vector quantization process partitions a codebook into buckets. A hashing function determines the locations of buckets in the codebook and is selected so that buckets containing similar codevectors start near each other in the codebook. One hashing function forms an index from the most significant bits of components of a vector. During encoding, the hashing function generates an index from an input vector, and a search for a codevector matching the image vector begins in a bucket indicated by the index. In one embodiment, the codebook contains flag fields to indicate the starts of buckets and pointer fields to create linked lists of codevectors which form the buckets. Codevectors are compared to the input vector by determining the mean squared error of the difference between the codevector and the input vector. A search is complete when the search finds a codevector having a difference with a MSE less than a threshold. Search time is reduced because each search begins in a bucket likely to contain a codevector matching the image vector.

14 Claims, 7 Drawing Sheets

HASHING-BASED VECTOR QUANTIZATION

This application is a continuation of Ser. No. 08/434,440 filed May 3, 1995 now U.S. Pat. No. 5,832,131.

REFERENCE TO MICROFICHE APPENDIX

The present specification comprises a microfiche appendix. The total number of microfiche sheets in the microfiche appendix is one. The total number of frames in the microfiche appendix is 22.

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

1. Field of the Invention

This invention relates to devices and processes for encoding digitized information using vector quantization.

2. Description of Related Art

Hashing is a database technique which organizes records of a database into indexed "buckets" and uses a hashing function to identify the bucket containing a desired record. The hashing function has an input called a key which depends on a record being sought and an output which is an index. The index indicates the location (i.e. starting address) of a bucket containing the desired record. The bucket indicated by the index is searched to find the desired record.

An example of a hashing-based database is a set of customer records for a cash machine, where each record has a unique 19-digit card number. To find a customer's record, an exhaustive search can be made through the database until a record containing the card number is found. This typically results in an unreasonably long search time. Alternatively, a directory to the database could contain pointers to individual records indexed by 19-digit card numbers, but the directory would greatly increase the size of the database. An alternative is to apply a hashing function to the 19-digit card number to generate an index within a range smaller than the range of the card number. The hashing function could, for example, be a mask which preserves the five least significant digits of the card number. Since the range of the hashing function is smaller than the range of the card number, more than one customer record may hash to the same index. When this happens, the index indicates a bucket containing more than one record. The bucket is searched for the desired record, but searching the bucket takes considerably less time than searching the entire database. Additionally, the amount of memory required to implement the hashing function is orders of magnitude less than memory required for a directory of all card numbers.

In the field of digital compression, vector quantization is a coding technique which reduces the amount of data required to represent information such as a digitized sound or image. For vector quantization, a series or array of digital values is partitioned into subsets referred to as vectors. Each vector has components which are values from the series or array. For encoding, a vector is replaced by an index indicating a codevector which most closely matches the vector. Replacing vectors with indices compresses the series or array to fewer digital values. The information is decoded by replacing the indices with codevectors from the codebook.

An example use of vector quantization is in image coding. A digitized image represented by a two-dimensional array of values can be partitioned into image vectors, wherein each image vector is a set of sixteen 8-bit values which represents the intensities of pixels in a 4-by-4 block of pixels. Representing such image vectors without coding requires sixteen bytes of information per image vector. When encoding an image, each image vector is compared to every codevector in a codebook to find a best match. If the codebook contains 256 codevectors, a one-byte index which identifies the best match codevector replaces a 16-byte image vector. This provides a 16-to-1 reduction in the amount of information that must be stored or transmitted to represent the image.

A problem with vector quantization is the relatively long encoding time required to find the best codevector for each image vector in an image. In many applications, such as videophones, vectors must be quantized in real time as images and sounds are generated. Consequently, a number of techniques have been proposed to reduce the encoding time which include tree-structured vector quantization, finite-state vector quantization, and cache vector quantization. Still, fast processes are needed for vector quantization to facilitate real time encoding in systems such as videophones.

SUMMARY OF THE INVENTION

In accordance with this invention, a hashing-based vector quantization process organizes a codebook to reduce search time. Codevectors in the codebook are stored in buckets which have indices (starting addresses) that are given by a hashing function and are related to the value of the codevectors. The hashing function is selected so that two buckets containing similar codevectors are near each other in the codebook. One example hashing function forms an index from the most significant bits of components in a vector.

During encoding, the hashing function is applied to an image vector to generate an index which indicates an address in the look-up table, and a search for a codevector matching the image vector begins with the bucket that starts nearest to the index indicated by the hashing function. Each codevector in the bucket is compared to the image vector by determining a norm such as the mean squared error (MSE) of the codevector when compared to the image vector. The search is complete once the search finds a codevector having a difference with a norm less than a preselected threshold. Search time is reduced because the hashing function starts searches in areas of the codebook most likely to contain codevectors closely matching the image vectors.

In one embodiment of the invention, a codebook contains fields for codevectors, fields for flags indicating the starts of buckets, and fields for pointers to create a linked list defining the search order through the buckets. Codevectors can be ordered in buckets so that the most popular codevector (the codevector which occurred most frequently during training) is at the start of a bucket. This reduces average search time because the codevectors most likely to match an image vector are compared to the image vector first.

Hashing-based vector quantization has the speed advantages of a directed search and reasonable memory requirements. Experiments show that hashing-based vector quantization maintains image quality while reducing encoding time. For example, for 2-by-2 image vectors and 1024 codevectors in the codebook, encoding time was reduced by a factor of 10 without significant loss of image quality.

DETAILED DESCRIPTION OF THE PREFERRED EMBODIMENTS

In accordance with an embodiment of the invention, a hashing function both orders buckets of codevectors in a codebook and selects the start of a search for a codevector which matches an input vector. The search compares the input vector to codevectors from the codebook and stops when a comparison indicates the difference between a codevector and the input vector has a norm that is less than a predefined threshold. The search is performed bucket-by-bucket, starting with the bucket nearest the index generated by applying the hashing function to the input vector. Search times for hashing-based searches are less than searches that start at a fixed location in the codebook because a codevector matching the input vector is most likely to be in a bucket having an index similar to the index for the input vector.

Vector quantization can compress any information, and is particularly well suited for applications such as image and sound encoding where similar patterns (or vectors) tend to repeat. The following emphasizes the example of coding an input vector which is an image vector (a portion of an image). However, processes and devices described can compress other information.

Figure 1A:
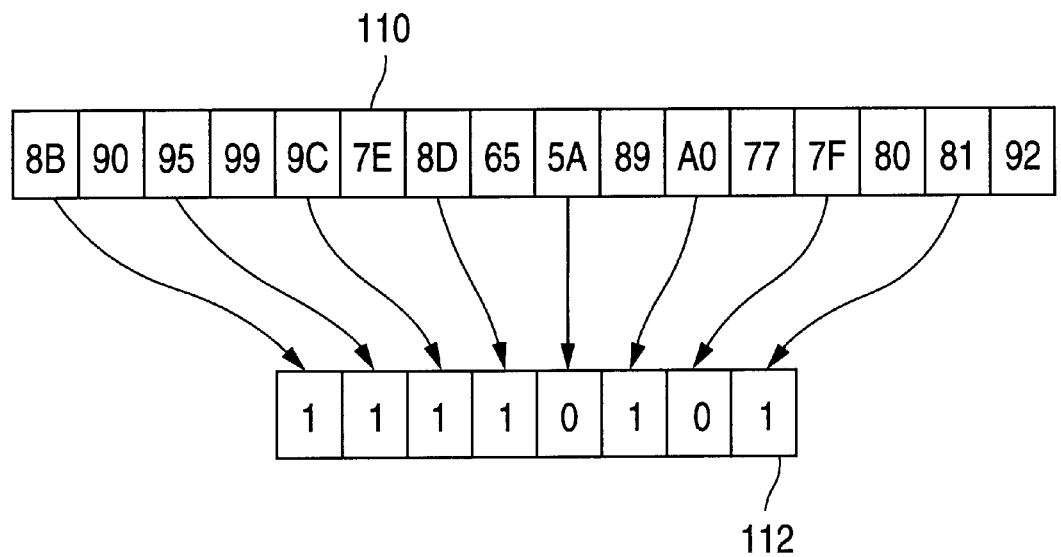
FIGS. 1A and 1B illustrate the action of hashing functions in accordance with example embodiments of the invention.
Figure 1B:
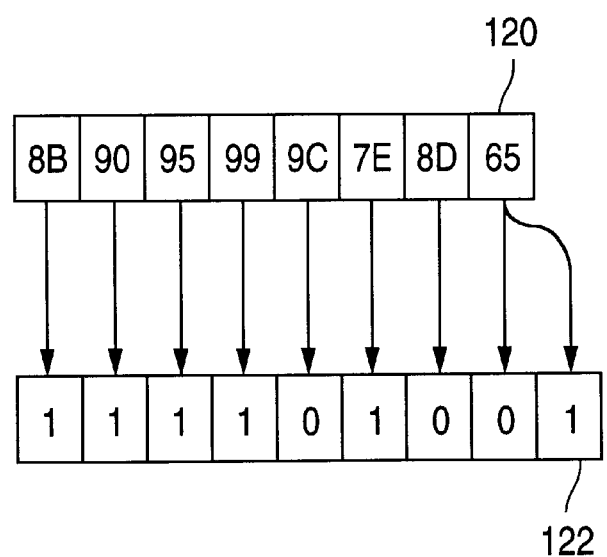

FIGS. 1A and 1B illustrate exemplary hashing functions in accordance with the invention. The key of the hashing functions is an image vector, and the output of the hashing function is an index which is a portion of the image vector. FIG. 1A shows an example where an image vector 110 contain sixteen 8-bit values, and the codebook for encoding the image vectors contains 256 codevectors. The hashing function takes the most significant bit (MSB) from eight of the pixel values in image vector 110 to generate an 8-bit index 112. FIG. 1B shows an example where an image vector 120 contains eight 8-bit values, and the codebook for encoding the image vectors contains 512 codevectors. The hashing function takes one MSB from each of seven of the pixels values in image vector 120 and the two MSBs from an eighth pixel value to generates a 9-bit index 122. Hashing functions such as illustrated in FIGS. 1A and 1B are referred to herein as MSB (most significant bit) hashing functions because such functions generate an index from the most significant bits of components of the image vectors. Since the most significant bits of components are most indicative of the character of a vector, MSB hashing functions tend to map similar image vectors (and codevectors) to a similar indices.

Many alternatives to MSB hashing functions can be used in accordance with the invention. Another hashing function averages or sums the components of an input vector and truncates the result to the number of significant bits desired in the index. The desired properties of a hashing function for use in vector quantization are (1) that the hashing function maps similar vectors and codevectors to similar indices and (2) that the hashing function distributes different codevectors across the range of indices.

For a vector quantization process in accordance with an embodiment of the invention, codevectors are determined using conventional training techniques such as the Linde-Buzo-Gray (LBG) algorithm. "Vector Quantization and Signal Compression" by Allen Gersho and Robert M. Gray (1992), which describes conventional training techniques and use of vector quantization in signal compression, is incorporated by reference herein in its entirety.

Applying the hashing function to the codevectors assigns indices to the codevectors. The index assigned to a codevector by the hashing function is referred to herein as the hashed index for the codevector. The codebook index for a codevector identifies the location of the codevector in the codebook and must be unique for each codevector. When codevectors collide, that is when the hashing function assigns the same hashed index to two or more codevectors, one of the colliding codevectors may be assigned a codebook index that is equal to the hashed index, but the other colliding codevectors must have codebook indices which differ from the hashed index. Codevectors having the same hashed index can be organized in a bucket defined by a linked list that starts with a codevector at the hashed index. Other codevectors in the bucket are stored elsewhere in the codebook.

Figure 2:
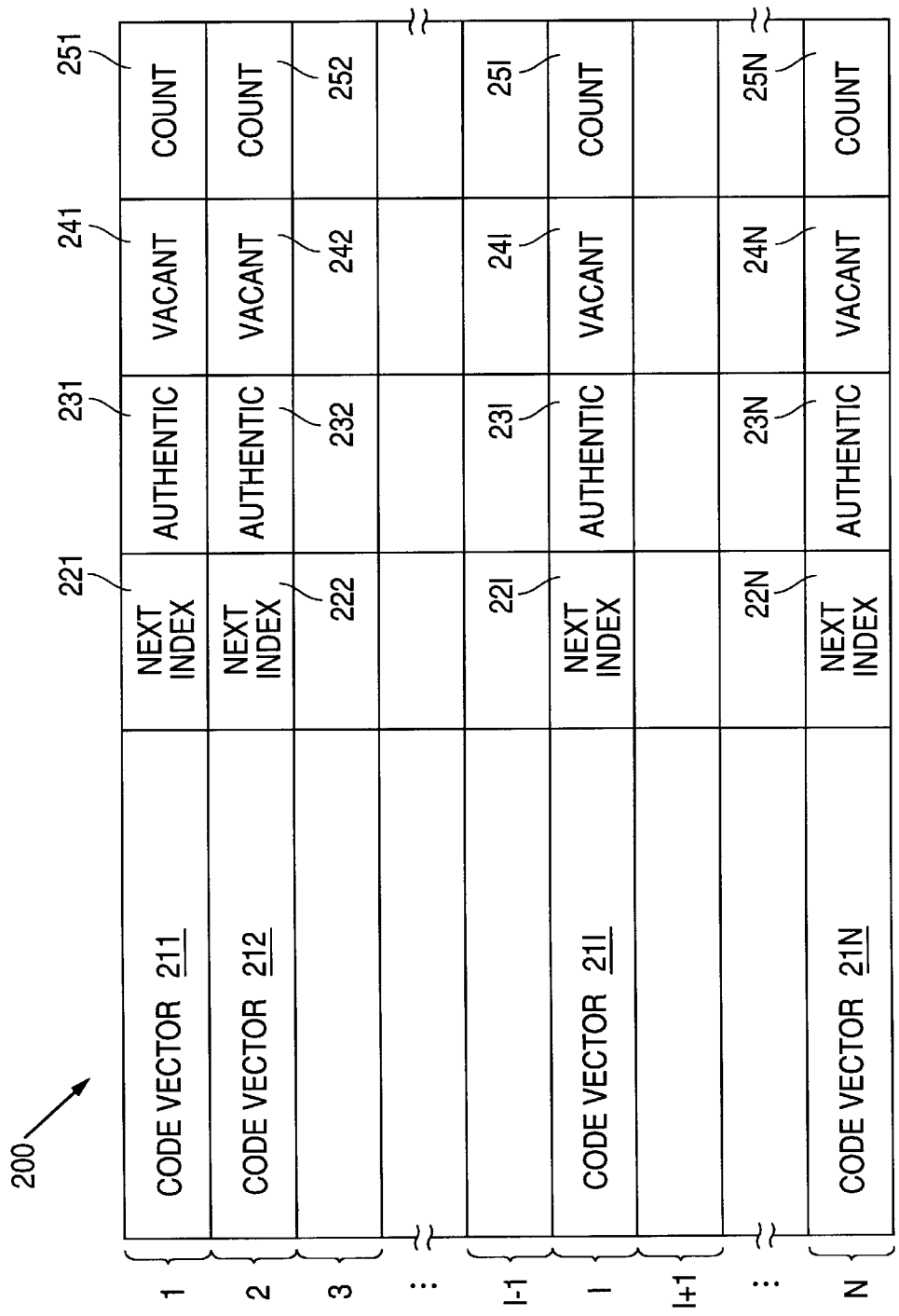
FIG. 2 shows a block diagram of a codebook in accordance with an embodiment of the invention.
Figure 5:
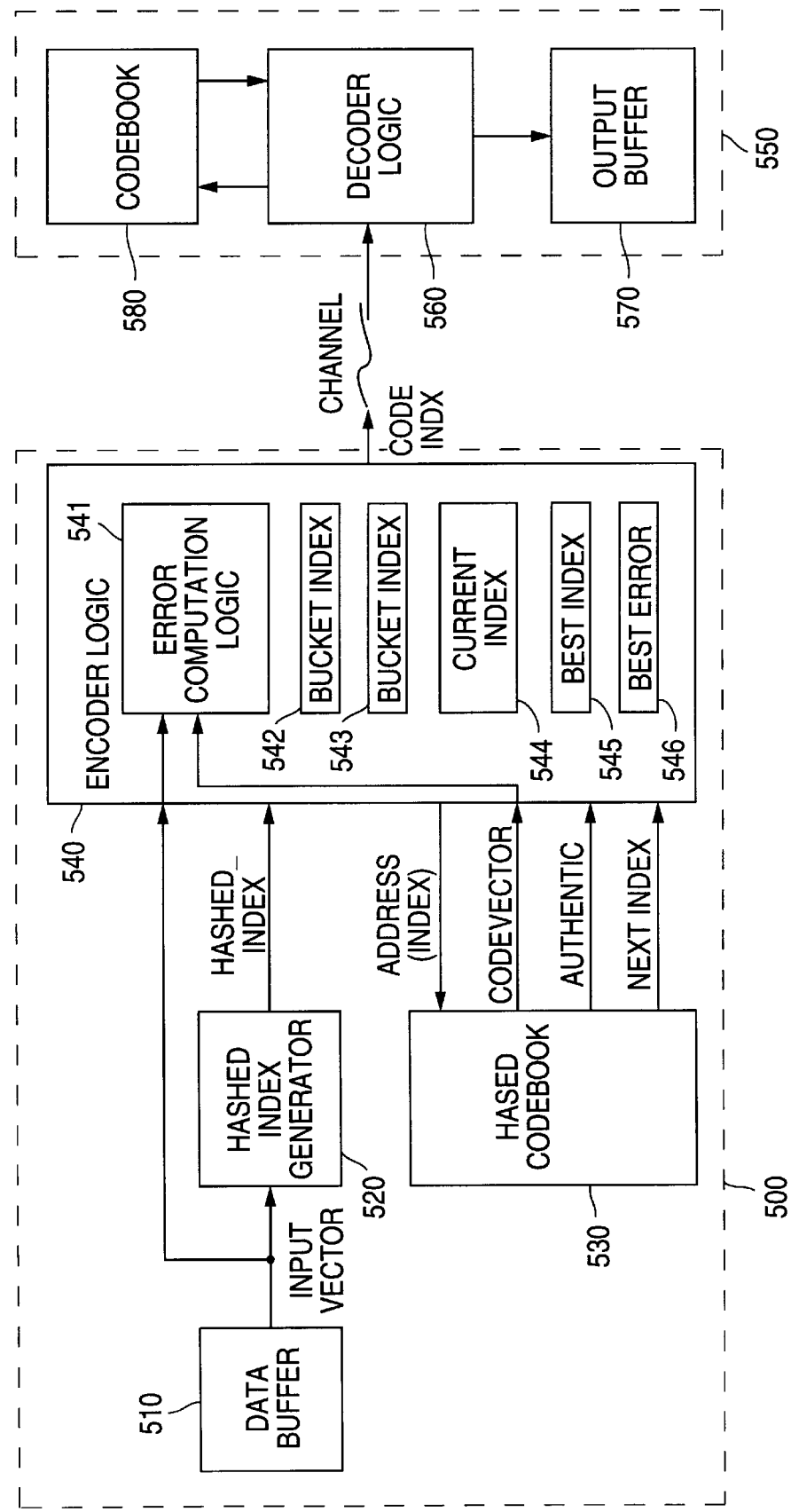
FIG. 5 shows a block diagram of a communication system including an encoder in accordance with an embodiment of the invention.

Mapping codevectors into a codebook for the hashing-based vector quantization uses information in addition to the codevectors. FIG. 2 shows a codebook 200 which is a memory structure that may be provided in an encoder or a decoder circuit shown in FIG. 5. Codebook 200 contains N bins indexed by values 1 to N. The bins contain codevector fields 211 to 21N, pointer fields 221 to 22N, and flag fields 231 to 23N and 241 to 24N, and count fields 251 to 25N.

All of the fields of codebook 200 are used while ordering codevectors. Encoding techniques described below use codevector fields 211 to 21N, pointer fields 221 to 22N, and flag fields 231 to 23N. Fields 241 to 24N and 251 to 25N can be deleted or ignored during encoding. Decoding requires only codevector fields 211 to 21N. This reduces the amount of side information required when transmitting a codebook to a decoder.

Well known training techniques generate a set of N codevectors. Example training techniques usable in embodiments of this invention are described in "Vector Quantization and Signal Compression" which was incorporate by reference above. Conventionally, training partitions training images into training vectors and selects codevectors such that each training vector corresponds to one of the codevectors and a total of the differences between the training vectors and corresponding codevectors is a minimum. Each difference between a training vector and the corresponding codevector is determined by calculating a norm such as means squared error (the sum of squared differences in components divided by the number of components) or the sum of the absolute value of differences in components. Counting the number of training vectors mapped to a codevector indicates the codevector popularity or likelihood that the codevector will match an input vector during coding. Count values generated during training or coding can be used during ordering of a hashed codebook.

Figure 3:
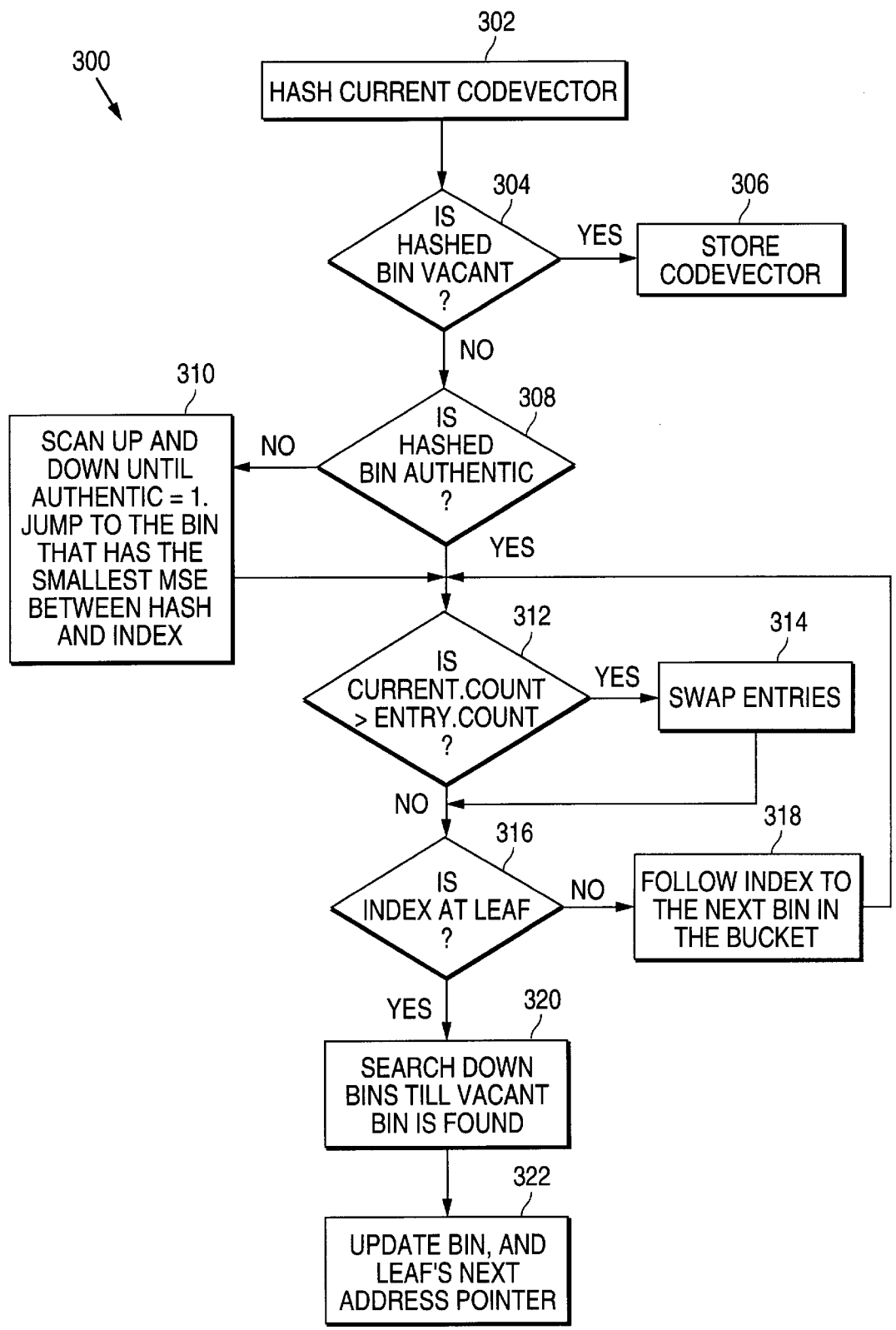
FIG. 3 shows a flow diagram of a process used for storing codevector in a codebook ordered according to a hashing function.

Codevectors are stored in codebook 200 in an order that depends on the hashing function to be used during encoding. FIG. 3 shows a flow diagram of a process 300 for ordering codevectors in codebook 200. Process 300 is typically performed off-line that is not during encoding and transmission of data and generates a codebook for real-time signal compression encoding. Typically, process 300 is executed in a computer system.

Process 300 begins in step 302 by applying the hashing function to a current codevector to generate a hashed index I for the current codevector. The index I indicates a bin in codebook 200 which includes a codevector field 21I, a pointer field 22I, flag fields 23I and 24I, and a count field 25I. Step 304 checks flag field 24I to determine whether the bin corresponding to index I is vacant or occupied. If the bin is vacant, process 300 transfers to step 306, stores the current codevector in codevector field 21I, sets flag field 23I to indicate that the codevector stored in codevector field 21I is authentic (i.e. has a hashed index equal to the codebook index), and clears flag field 24I to indicate that the bin is now occupied. A count indicating the number of times the current codevector was used during training is stored in count field 25I. Pointer field 22I is set to point to the bin corresponding to index I to indicate that the bucket contains only one bin (and one codevector).

If, in step 304, the bin corresponding to index I is not vacant, a collision has occurred, and step 308 checks whether the codevector in the bin is authentic, that is whether the codevector stored in the bin corresponding to codebook index I has hashed index I. Each authentic codevector is at the head of a linked list which forms a bucket in codebook 200. Codevectors that are not authentic are middle or tail elements of the linked lists. Accordingly, if the bin having index I contains an authentic codevector, the current codevector is inserted into the bucket which begins at codebook index I; and process 300 proceeds to step 312 described below.

If, in step 308, flag field 23I does not indicate the bin contains an authentic codevector, the codevector in the bin is a middle or tail element of a bucket. The codevectors in that bucket may be radically different from the current codevector. Instead of adding the current codevector to the bucket containing the hashed bin, step 310 searches to find the nearest authentic codevector to the codebook index I.

Steps 312, 314, 316, 318, 320, and 322 insert current codevector in a bucket. Following step 310 or 308, step 312 compares the current codevector to a codevector in a current bin in the bucket. Initially, the current bin is the first bin in the linked list for the bucket. When ordering codevectors in a bucket, it is desirable to place the most popular codevector at the start of the bucket so that during the encoding process, searches begin with the most popular codevector and continue with other codevectors only if the most popular codevector is not similar enough to the input vector. Placing the most popular codevectors near the start of a bucket reduces average search time. Step 312 compares the count for the current codevector to the count in the count field entry of the current bin. If the current codevector has a higher count, step 314 swaps the current codevector with the codevector stored in the current bin. Swapping changes codevector and count fields in the current bin to values for the current codevector. The less popular codevector is stored lower in the linked list.

Step 316 checks the pointer field of the current bin to determine if the bin is at the tail of the linked list for the bucket. The last bin of a linked list has a pointer field set to the codebook index of the bin. If the current bin is the tail of a linked list, process 300 transfers to step 320 and searches for a vacant bin. Otherwise, process 300 transfers to step 318 and reads the pointer field to determine the next bin in the bucket. The process then transfers to step 312 and compares the count for the current codevector to the count field of the next bin. A process loop including steps 312, 314, 316 and 318 is repeated until the last (or leaf) bin of the linked list is found. Process 300 then transfers to step 320.

Step 320 finds a vacant bin in the codebook. The location of the vacant bin is not critical because searches are performed bucket-by-bucket and each bucket starts with an authentic bin. After a vacant bin is found in step 320, step 322 sets the pointer field in the previous bin to point to the vacant bin, and then the current codevector or a swapped codevector is stored in the vacant bin. Flag fields are set to indicate the bin is now occupied but not with an authentic codevector, and the pointer field is set to indicate the end of a linked list. After step 322, a next codevector is stored in codebook 200 using process 300. Process 300 is repeated for each codevector until codebook 200 is full.

Process 300 can be varied in a variety of ways in accordance with the scope of this invention. For example, codevectors can be added to table 200 in an order from most popular to least popular. If codevectors are added in this order, the count field can be eliminated from codebook 200, and the codevectors in the linked lists are ordered from most popular to least popular without checking counts or swapping codevectors as in step 312 or 314. Additionally, codevectors can be added to codebook 200 in two passes. A first pass hashes all of the codevectors and stores only those codevectors that hash to vacant bins. A second pass adds the codevectors which were not stored during the first pass. Adding codevectors in two passes has the advantage of maximizing the number of authentic codevectors which reduces the size of buckets and reduces encoding time.

Figure 4:
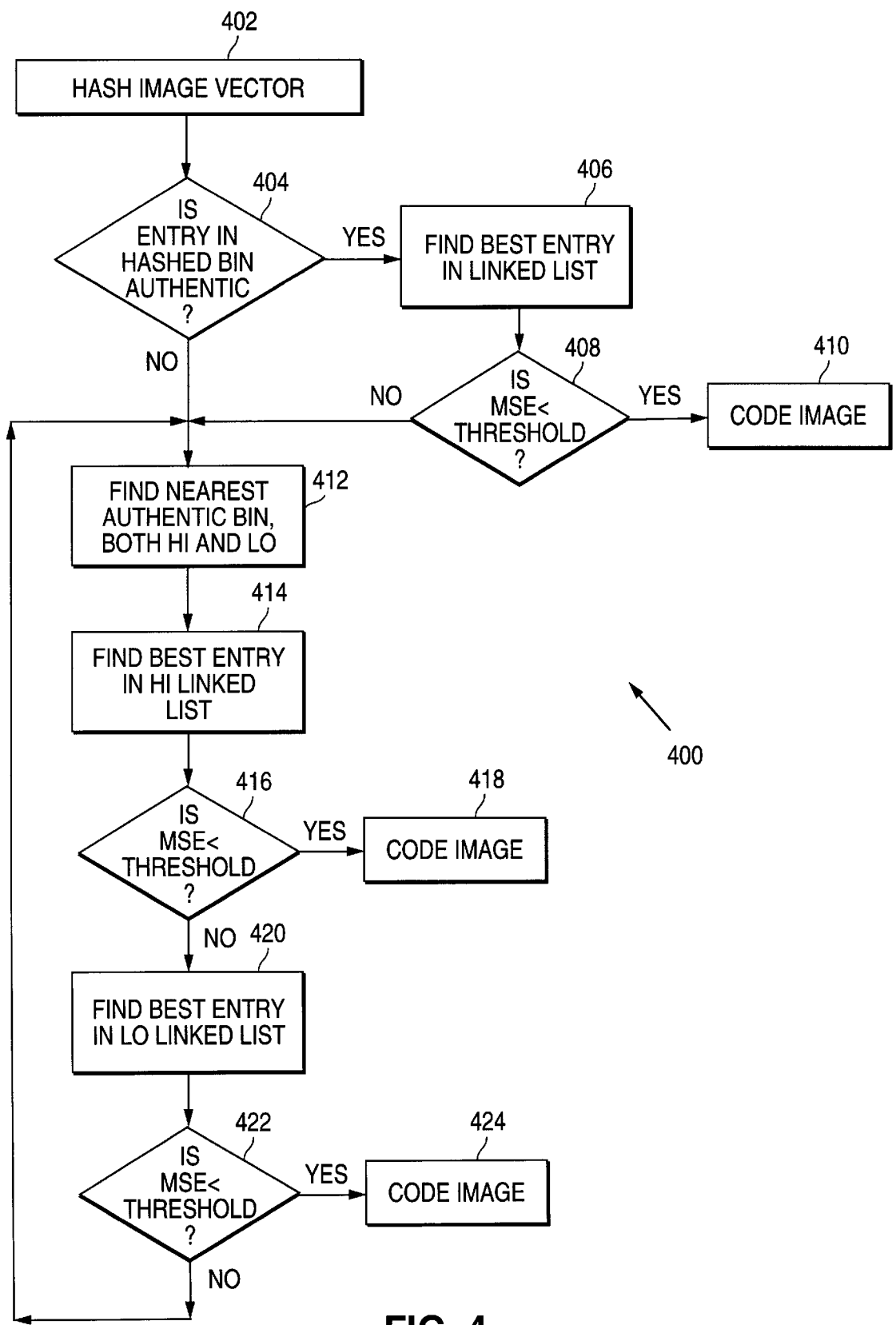
FIG. 4 shows a flow diagram of a process for hashing based vector quantization in accordance with an embodiment of the invention.

FIG. 4 shows the flow diagram of a vector quantization encoding process 400 in accordance with an embodiment of the invention. Encoding process 400 is described in conjunction with an encoder 500 shown in FIG. 5. Encoder 500 includes an input data buffer 510 which includes a digital representation of information to be transmitted to a decoder 550. For video encoding, data buffer 510 typically contains two-dimensional arrays of pixel values which represent an image or two-dimensional arrays of difference values which represent a difference between consecutive frames of a moving image. A signal from data buffer 510 represents input vectors which are coded or compressed by encoder 500.

Encoding process 400 starts in step 402 when a hashed index generator 520 determines a hashed index for an input vector from data buffer 510 and asserts a signal indicating the hashed index to encoder logic 540. Encoder logic stores the hashed index in registers 542, 543, and 544 and asserts an address signal based on the index to a hashed codebook 530. Bins in hashed codebook 530 contain codevectors, a flag field indicating whether codevector is authentic, and a pointer field indicating the next bin in a bucket.

In step 404, encoder logic 540 checks the flag field in the bin indicated by the hashed index to determine whether the codevector in the bin is authentic. If it is, encoder logic 540 transfers to step 406 and searches the bucket headed by the hashed bin. During the search, error computation logic calculates MSEs between the input vector from data buffer 510 and codevectors in the bucket of hashed codebook 530. The bucket is searched in an order starting with the hashed bin and proceeding to bins pointed to by the next index from the pointer field. Register 544 indicates the index of the current bin being searched.

The search of a bucket is complete when an MSE between a codevector and the input vector is less than or equal to a predefined threshold or when the tail of the bucket is reached. If, in step 406, encoder logic 540 finds a codevector that differs from the input vector by less than the predefined threshold, the codebook index of the codevector found is the code for the input vector. Otherwise, process 400 transfers to steps 412 to 422 and searches next higher and next lower buckets for a better match to the input vector.

If, in step 404, the hashed bin does not contain an authentic codevector, the codevector in the bin is in the middle or at the end of a linked list and may correspond to a bucket that differs significantly from the input vector. In this case, encoder logic 540 transfers to step 412 and searches a bucket that begins near the hashed bin. Generally, this bucket contains codevectors which are similar to the input vector.

Step 412 searches the codebook for the next higher and next lower bins in the codebook which are authentic. The best codevector in the codebook is likely to be in a bucket that starts near the hashed index for the input vector because the hashing function tends to group similar codevectors at similar hashed indices. The indices for the next higher and next lower buckets are stored in registers 542 and 543. Step 414 searches the bucket corresponding to the next higher authentic codevector by calculating the MSEs between the input vector and codevectors in the bucket. If, in step 416, the MSE between the input vector and one of the codevectors in the bucket is less than the threshold, the codebook index for that codevector is used as the code for the input vector. If not, step 420 searches the bucket corresponding to the next lower authentic codevector, and if an MSE between the input vector and one of the codevectors in that bucket is less than the threshold, the codebook index for that codevector is the code index for the input vector.

Steps 412, 414, 416, 418, 420, and 422 are repeated until either an MSE less than the threshold is found or the entire codebook has been searched. During each of steps 406, 412, and 420, best index and best error values in registers 545 and 546 are updated each time a codevector with an MSE lower than the value in register 546 is found. If the entire codebook is searched without finding an MSE less than the threshold, the best index, for the codevector providing the lowest MSE from the input vector, is the code index used for the input vector. When the entire codebook is searched, hashing based vector quantization is equivalent to the full-search vector quantization.

The code index is transmitted as part of compressed signal to decoder 550. Decoding of hashing-based vector quantization is performed in a conventional manner. A codebook 580 in decoder 550 contains only codevectors, and the codevectors are ordered in the same way as in hashed codebook 530. Decoder logic 560 replaces codebook indices with corresponding codevectors during reconstruction of information in an output buffer 570. When the information represents an image, output buffer 570 contains a decoded two-dimensional array of pixels representing the decoded image which can be displayed on a conventional video display.

The microfiche appendix contains C language routines which implement hashing-based VQ coding. Routines PreMapCodeBook and MapCodeBook perform a two pass ordering of an input codebook p_book generated using the LBG or other training process. A function Hash generates a hashed index for an input vector vect. Routines CodeImage and DeCodeImage respectively code and decode training vectors.

Figure 6A:
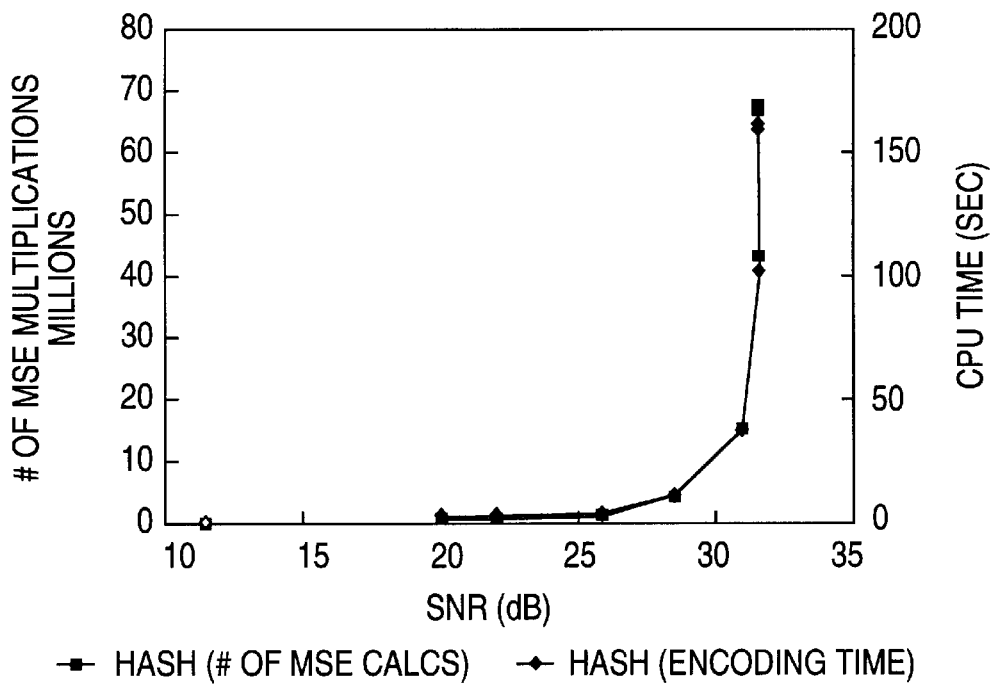
FIGS. 6A and 6B show plots of search time verses image quality for example vector quantization systems in accordance with an embodiment of the invention.
Figure 6B:
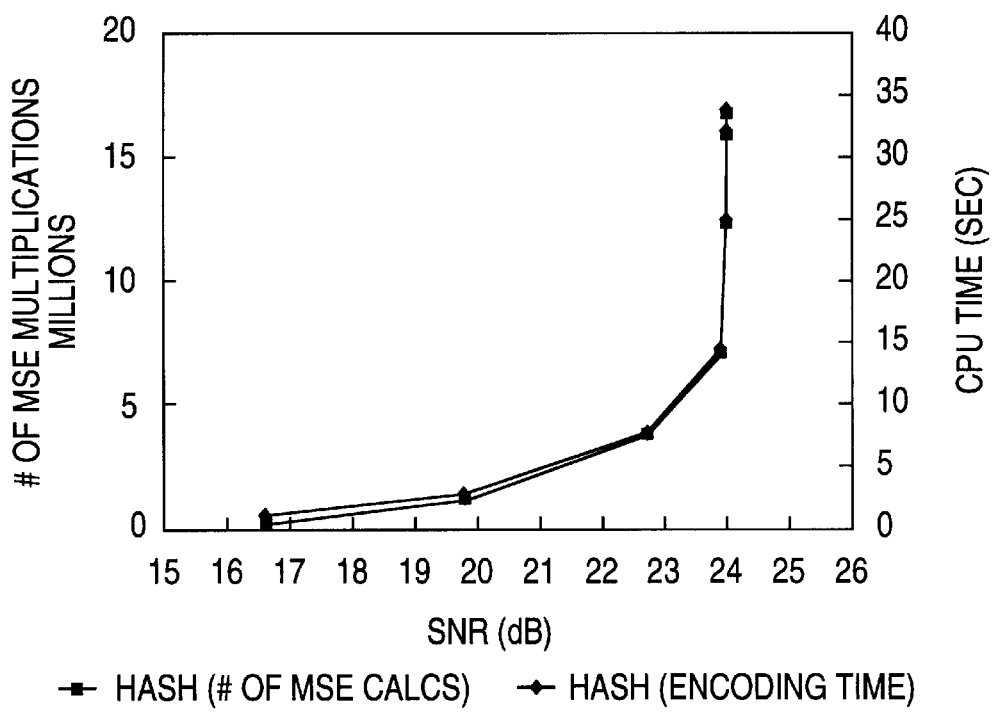
Figure 6C:
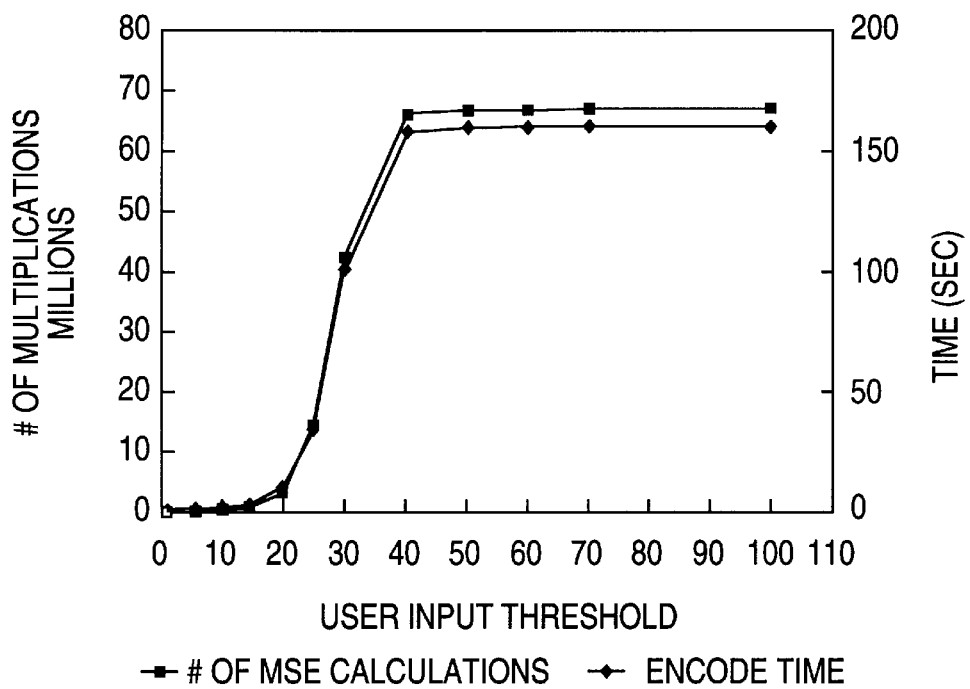
FIGS. 6C and 6D show plots of search time verses encoding threshold for example vector quantization systems in accordance with an embodiment of the invention.
Figure 6D:
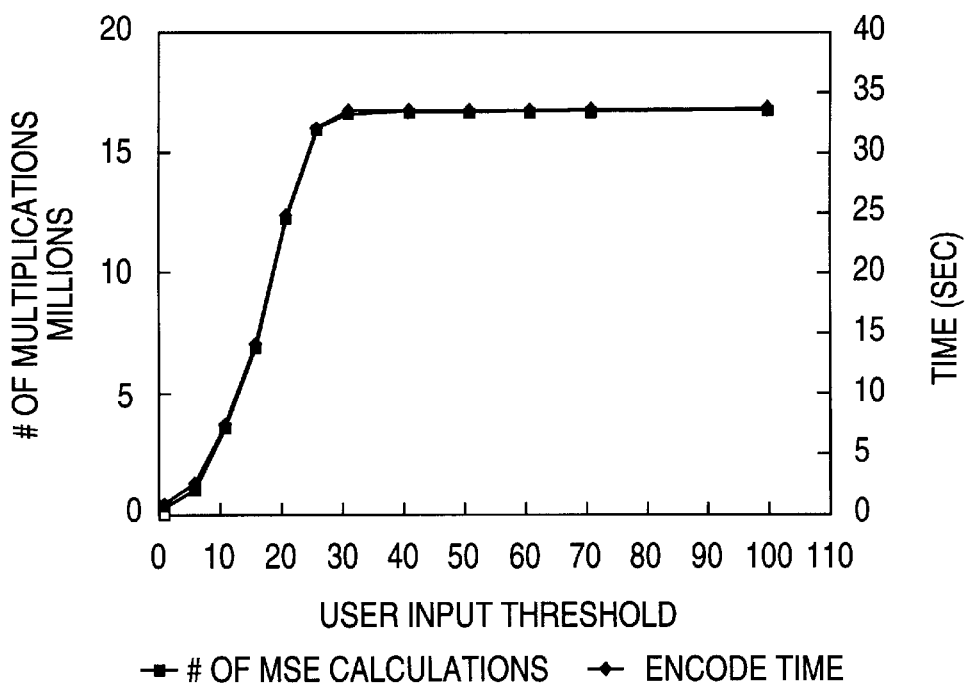

FIGS. 6A and 6B present two plots of image quality as indicated by signal to noise ratio (SNR) versus the number of multiplication and CPU time during a search. FIGS. 6C and 6D present two plots of coding threshold versus the number of multiplications and CPU time during a search. In the plots, image quality and the error threshold are in dB and are given by $$SNR = -10 * \log_{10}(MSE/255^2).$$

Typically, the image quality is better than the SNR of the threshold because most codevectors found have less error than the threshold.

A very small threshold used during a search for a codevector causes hashing-based vector quantization to search the entire codebook which takes as long as a full-search. In FIGS. 6A and 6B, the top-right endpoints of the curves represent the full-search VQ. Decreasing the threshold level measured in dB decreases search time (number of multiplications) and the quality of the decoded image. However, the drop in search time is much faster than the decrease in quality. As shown in FIG. 6A, for 2-by-2 blocks of pixels (four component image vectors) and a codebook with 1024 codevectors, encoding time was reduced by a factor of 10 with less than 1 dB loss of image quality when compared to exhaustive searches of the codebook. FIG. 6B shows that for 4-by-4 blocks of pixel values (sixteen component image vectors) and a codebook containing 256 codevectors, encoding time decreased by a factor of 3 with less than 1 dB degradation in image quality when compared to an exhaustive search of the codebook.

FIGS. 6C and 6D show the effect of the threshold on encoding time. FIG. 6C illustrates how the threshold affects an embodiment which quantizes vectors that are 2-by-2 blocks of pixel values. FIG. 6D illustrates the effect on an embodiment quantizing 4-by-4 blocks of pixel values. The threshold selected for a particular encoding system should depend on the available encoding time, available processing power, and the picture quality required.

One embodiment of the invention changes the threshold dynamically according to the available processing power. For example, in a system where a microprocessor performs several functions including vector quantization for a video (or moving) image, the threshold in dB is increased to improve image quality when functions other than vector quantization demand less processing time. When demands on the microprocessor increase, the threshold in dB is lowered to reduce encoding time and allow more time for other functions.

Although the present invention has been described with reference to particular embodiments, the description is only an example of the invention's application and should not be taken as a limitation. Various adaptations and combinations of features of the embodiments disclosed will be apparent to those skilled in the art and are within the scope of the present invention as defined by the following claims.

We claim:

1. A method for encoding information, comprising:

generating an input vector which represents a portion of the information;

applying a hashing function to the input vector to generate a hashed index corresponding to the input vector;

searching a codebook, wherein searching comprises:
  beginning to search the codebook, at an address that depends on the hashed index of the input vector;
  in response to first finding a codevector such that a measure of a difference between the codevector and the input vector is less than a threshold, ending the search upon finding the codevector; and
  in response to failing to find any codevector that differs from the input vector by less than the threshold, completing a search of the entire codebook; and
generating a signal which represents a codebook index of a found codevector, the found codevector being such that a measure of a difference between the found codevector and the input vector is smallest of any measures of differences determined in the searching step.

2. The method of claim 1, wherein the step of applying the hashing function comprises generating a hashed index which contains a most significant bit from a component of the input vector.

3. The method of claim 1, wherein the step of applying the hashing function comprises determining an average of components of the input vector and determining the hashed index from the average.

4. The method of claim 1, further comprising:
  applying the hashing function to codevectors to generate a hashed index for each of the codevectors; and
  storing the codevectors in the codebook, wherein storing the codevectors comprises storing at least one of the codevectors at an address in the codebook indicated by the hashed index for the codevector.

5. The method of claim 4, wherein storing the codevectors in the codebook further comprises:
  partitioning the codebook into bins, wherein each bin has a different address;
  determining a hashed index of a first codevector, wherein each possible hashed index corresponds to an address of one of the bins;
  determining whether a first bin which has an address corresponding to the hashed index of the first codevector is vacant;
  storing the first codevector in the first bin if the first bin is vacant; and
  storing the first codevector in a second bin if the first bin is not vacant.

6. The method of claim 5, wherein storing the first codevector in the second bin further comprises creating a linked list which links the second bin to the first bin.

7. The method of claim 4, wherein storing the codevectors in the codebook further comprises:
  partitioning the codebook into bins, wherein each bin has a different address;
  for each codevector:
  determining a hashed index of the codevector;
  determining whether a bin which has an address corresponding to the hashed index of the codevector is vacant; and
  storing the codevector in the bin if the bin is vacant; and then
  for each codevector not stored in a bin of the codebook by the preceding steps:
    storing the codevector in a vacant bin; and
    creating a linked list which links the bin in which the codevector is stored to a bin which has an address corresponding to the hashed index of the codevector.

8. The method of claim 4, wherein storing a codevector at an address in the codebook indicated by the hashed index for the codevector further comprises setting a flag in the codebook to indicate that the codevector is stored at an address which corresponds to the hashed index of the codevector.

9. The method of claim 8, wherein searching the codebook comprises:
  determining whether a first address which corresponds to the hashed index of the input vector, also corresponds to a hashed index of a codevector stored at the first address;
  beginning the search at the first address if the first address corresponds to the hashed index of the codevector stored at the first address; and
  beginning the search at a second address which corresponds to a hashed index of a codevector stored at the second address if the first address does not correspond to the hashed index of the codevector stored at the first address.

10. The method of claim 1, wherein generating the input vector further comprises:
  partitioning a two-dimensional array of pixel values into blocks of pixel values; and
  generating components for the input vector, which are pixel values from a block that results from partitioning the two-dimensional array.

11. The method of claim 1, wherein searching the codebook further comprises determining a mean square error between the input vector and a codevector, the mean square error being the measure of the difference between the codevector and the input vector.

12. The method of claim 1, wherein searching the codebook further comprises determining a mean absolute error between the input vector and a codevector, the mean absolute error being the measure of the difference between the codevector and the input vector.

13. A coder comprising:
  a memory for storing a codebook;
  an index generator which generates a signal representing a hashed index for an input vector; and
  encoder search logic operably coupled to the memory and the index generator, wherein the encoder search logic begins at an address indicated by the hashed index and searches through the codebook in the memory until first finding a codevector which differs from the input vector by less than a threshold and if no codevector is found that differs from the input vector by less than the threshold, searches the entire codebook for a codevector that differs least from the input vector.

14. The coder of claim 13, wherein:
  the memory is partitioned into a plurality of bins, each bin comprising a field for storing a codevector, a field for storing a flag value, and a field for storing a pointer; and
  the encoder search logic begins a search by comparing the input vector to a first codevector which is in a first bin that contains a first flag value and is closest to the address indicated by the hashed index and continues the search by comparing the input vector to a second codevector which is in a second bin indicated by a pointer stored in the first bin.

* * * * *